US011689839B2

(12) United States Patent
Huang

(10) Patent No.: US 11,689,839 B2
(45) Date of Patent: Jun. 27, 2023

(54) SEMICONDUCTOR DEVICE PACKAGE AND ACOUSTIC DEVICE INCLUDING THE SAME

(71) Applicant: Advanced Semiconductor Engineering, Inc., Kaohsiung (TW)

(72) Inventor: Ming-Tau Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/528,308

(22) Filed: Jul. 31, 2019

(65) Prior Publication Data
US 2021/0037307 A1 Feb. 4, 2021

(51) Int. Cl.
| H04R 1/10 | (2006.01) |
| H01L 23/31 | (2006.01) |
| H01Q 1/36 | (2006.01) |
| H01L 23/552 | (2006.01) |
| H01L 23/66 | (2006.01) |

(52) U.S. Cl.
CPC ....... *H04R 1/1041* (2013.01); *H01L 23/3121* (2013.01); *H01L 23/552* (2013.01); *H01L 23/66* (2013.01); *H04R 1/1016* (2013.01); *H04R 1/1025* (2013.01); *H04R 1/1075* (2013.01); *H01Q 1/36* (2013.01); *H04R 2420/07* (2013.01)

(58) Field of Classification Search
CPC .. H04R 1/1041; H04R 1/1016; H04R 1/1025; H04R 1/1075; H04R 2420/07; H01L 23/3121; H01L 23/552; H01L 23/66; H01Q 1/36

USPC ........... 381/74, 58, 151, 311, 380, 374, 150; 455/572, 573; 320/128; 429/322; 257/678, 684, 347, E27.001; 438/106
See application file for complete search history.

(56) References Cited

U.S. PATENT DOCUMENTS

| 10,827,249 | B1* | 11/2020 | Pine ..................... H04R 1/1041 |
| 2004/0052364 | A1* | 3/2004 | Bodley ................... H04M 1/05 379/430 |
| 2012/0039500 | A1* | 2/2012 | Silvestri ................. H04R 1/10 381/380 |
| 2013/0126991 | A1* | 5/2013 | Ehrenpfordt ......... H04R 19/005 257/416 |

(Continued)

FOREIGN PATENT DOCUMENTS

| CN | 104377348 A | 2/2015 |
| CN | 107708000 A | 2/2018 |

(Continued)

OTHER PUBLICATIONS

Partial Search Report for corresponding European Patent Application No. 19204023.6, dated Apr. 3, 2020, 13 pages.

*Primary Examiner* — Vivian C Chin
*Assistant Examiner* — Con P Tran
(74) *Attorney, Agent, or Firm* — Foley & Lardner LLP

(57) ABSTRACT

A wireless earphone comprises a battery, a speaker and a chamber/space. The battery has a first surface, a second surface opposite the first surface, and a third surface extended between the first surface and the second surface. The battery is disconnected from any protecting circuits. The speaker is disposed adjacent to the first surface of the battery. The chamber/space is defined by the battery and the speaker. The chamber/space is devoid of any electronic component.

9 Claims, 9 Drawing Sheets

(56) References Cited

U.S. PATENT DOCUMENTS

| | | | | |
|---|---|---|---|---|
| 2014/0151859 A1* | 6/2014 | Kim | ............... | H01L 25/0657 |
| | | | | 257/659 |
| 2015/0350762 A1* | 12/2015 | Birger | ............... | H04R 1/1025 |
| | | | | 381/74 |
| 2016/0050474 A1* | 2/2016 | Rye | ............... | H05K 7/1427 |
| | | | | 381/152 |
| 2016/0073188 A1* | 3/2016 | Linden | ............... | H04R 1/1025 |
| | | | | 381/309 |
| 2016/0225745 A1* | 8/2016 | Beer | ............... | H01L 25/50 |
| 2016/0232889 A1* | 8/2016 | Baker | ............... | H04R 1/1083 |
| 2016/0294225 A1* | 10/2016 | Blum | ............... | H02J 5/005 |
| 2017/0209095 A1* | 7/2017 | Wagner | ............... | A61B 5/6898 |
| 2018/0176674 A1* | 6/2018 | Tang | ............... | H04R 1/1016 |
| 2019/0045294 A1* | 2/2019 | Kim | ............... | H04R 1/1066 |
| 2019/0068770 A1* | 2/2019 | Seo, II | ............... | G06F 1/1605 |
| 2019/0327550 A1* | 10/2019 | Lindén | ............... | H04R 1/1025 |
| 2021/0067859 A1* | 3/2021 | Sakane | ............... | H01Q 1/273 |

FOREIGN PATENT DOCUMENTS

| | | |
|---|---|---|
| CN | 107770661 A | 3/2018 |
| CN | 20875449 U | 4/2019 |

* cited by examiner

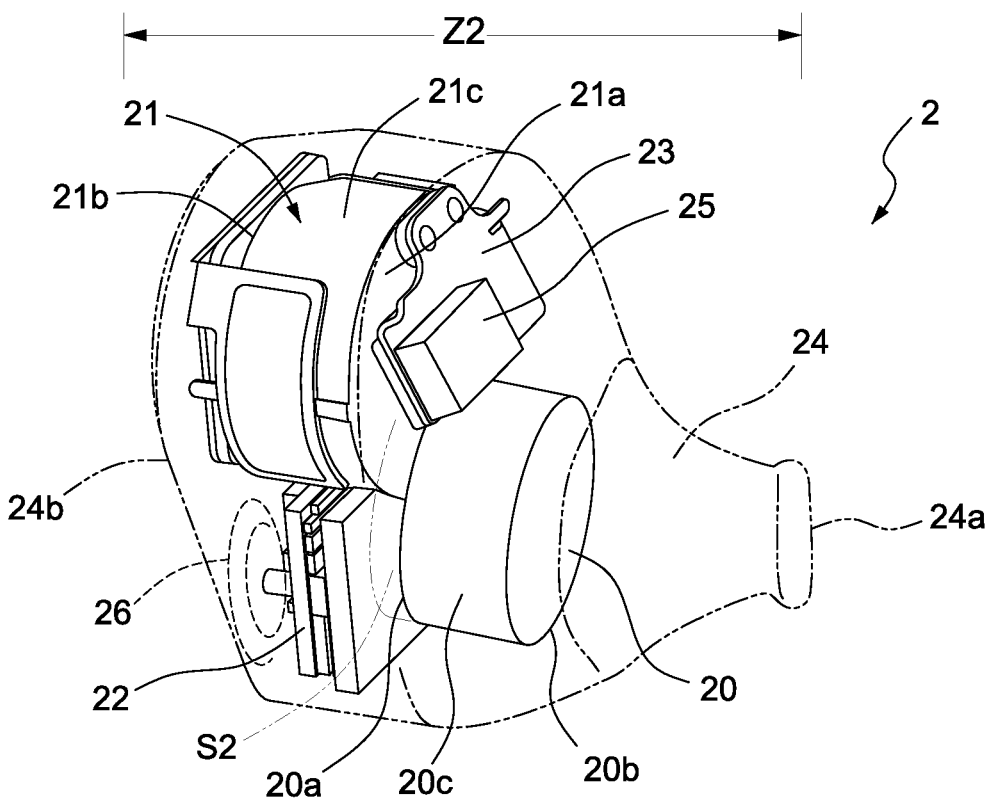
FIG. 2B
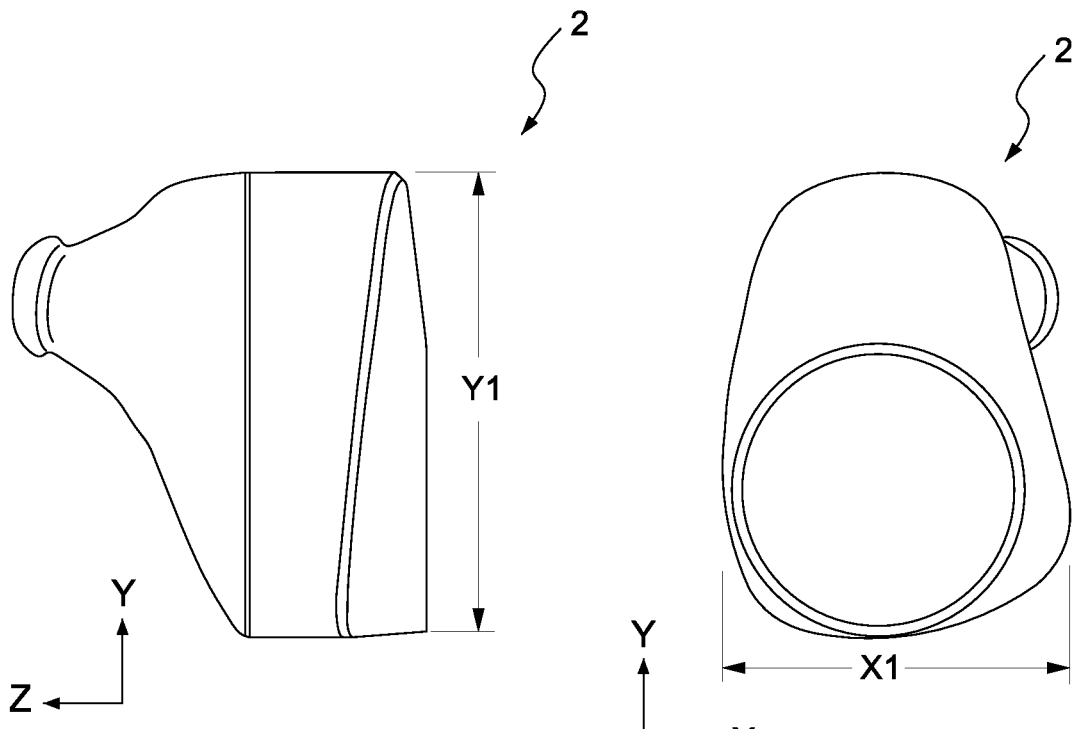
FIG. 2C
FIG. 2D

SEMICONDUCTOR DEVICE PACKAGE AND ACOUSTIC DEVICE INCLUDING THE SAME

BACKGROUND

1. Technical Field

The present disclosure relates generally to a semiconductor device package, and more particularly, the present disclosure relates to an acoustic device having the semiconductor device package.

2. Description of the Related Art

As technology advances, various circuits or modules can be integrated into one electronic device, e.g. an acoustic device (e.g. an earphone or a wireless earphone) to perform multifunction. However, miniaturization of the electronic device may adversely affect performance of the electronic device.

SUMMARY

In some embodiments, the present disclosure provides a wireless earphone. The wireless earphone comprises a battery, a speaker and a chamber/space. The battery has a first surface, a second surface opposite the first surface, and a third surface extended between the first surface and the second surface. The battery is disconnected from any protecting circuits. The speaker is disposed adjacent to the first surface of the battery. The chamber/space is defined by the battery and the speaker. The chamber/space is devoid of any electronic component.

In some embodiments, the present disclosure further provides a wireless earphone. The wireless earphone comprises a speaker, a battery and a first semiconductor device package. The battery is separated from the speaker and having a first surface, a second surface opposite the first surface, and a third surface extended between the first surface and the second surface. The first semiconductor device package is disposed adjacent to the second surface or the third surface of the battery. The first semiconductor device package comprises a substrate, a feeding structure and an encapsulant. The substrate has a first surface and a second surface opposite the first surface. The feeding structure is disposed on the first surface. The encapsulant encapsulates the whole second surface of the substrate.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 2B illustrates a perspective view of an assembly of the acoustic device as shown in FIG. 2A.

FIG. 2C illustrates a side view of the assembly of the acoustic device shown in FIG. 2B.

FIG. 2D illustrates another side view of the assembly of the acoustic device shown in FIG. 2B.

DETAILED DESCRIPTION

Figure 1A:
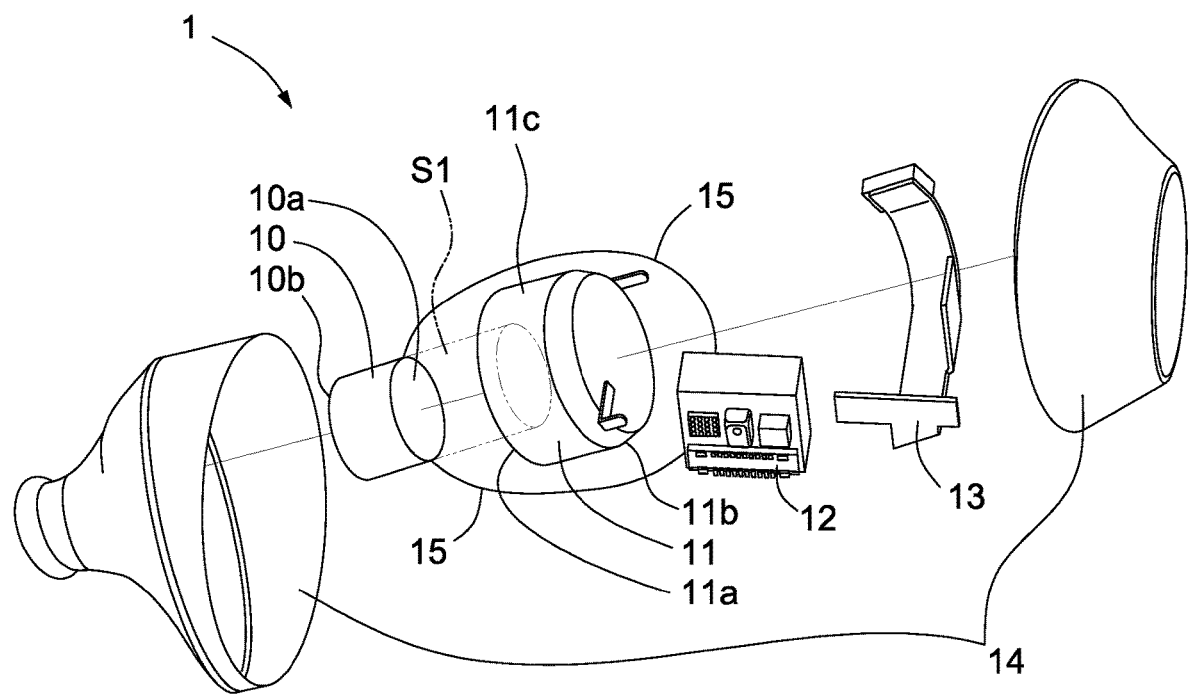
FIG. 1A illustrates an exploded view of an acoustic device in accordance with some embodiments of the present disclosure.

FIG. 1A illustrates an exploded view of an acoustic device 1 in accordance with some embodiments of the present disclosure. The acoustic device 1 includes a speaker 10, a battery 11, a semiconductor device package 12, an interconnect structure 13 and a housing 14. The speaker has a surface 10a and a surface 10b opposite to the surface 10a. The battery 11 has a surface 11a, a surface 11b opposite the surface 11a, and a surface 11c extended between the surface 11a and the surface 11b. The battery 11 is disconnected from any protecting circuits. The battery 11 includes a coin-like package. The battery 11 includes no aluminum cover. The capacity of the battery 11 may be larger than 60 mAh. For example, the battery 11 may include capacity of approximately 63 mAh.

The speaker 10 is disposed adjacent to the surface 11a of the battery 11. The surface 10a of the speaker 10 faces with the surface 11a of the battery 11. The surface 11a of the battery 11 may be a cathode of the battery 11. The structure of the semiconductor device package 12 is illustrated in the cross-sectional view of the semiconductor device package 5 in FIG. 5. The speaker 10 is connected to the semiconductor device package 12 by wires 15. The wires 15 do not penetrate the battery 11. The speaker 10 is separated from the battery 11 by a chamber/space S1. The housing 14 encloses the speaker 10, the battery 11, the semiconductor device package 12, and the interconnect structure 13. The interconnect structure 13 connects the battery 11 and the semiconductor device package 12. The interconnect structure 13 includes flexible print circuit (FPCs) or other interconnect structures.

Figure 1B:
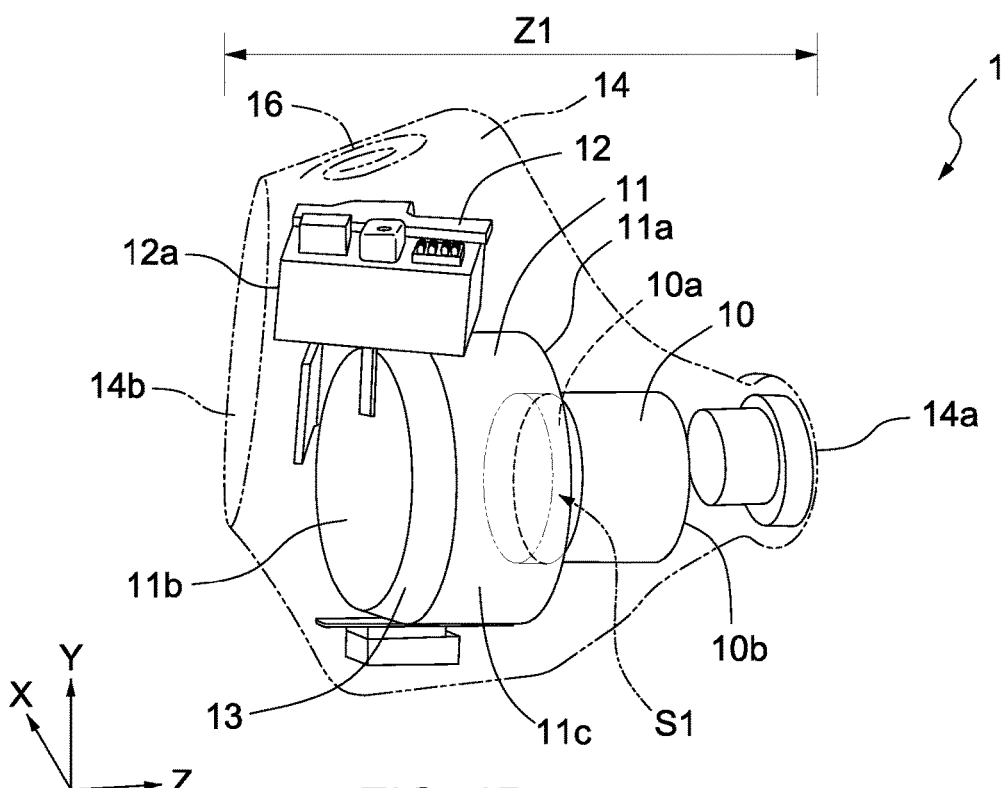
FIG. 1B illustrates a perspective view of an assembly of the acoustic device as shown in FIG. 1A.

FIG. 1B illustrates a perspective view of an assembly of the acoustic device 1 as shown in FIG. 1A. The semiconductor device package 12 is disposed adjacent to the surface 11c of the battery 11. The semiconductor device package 12 is disposed adjacent to the surface 11b of the battery 11. The semiconductor device package 12 is electrically connected to the surface 11c of the battery 11 by the interconnect structure 13. The speaker 10 is separated from the surface 11a of the battery 11 by the chamber/space S1. The chamber/space S1 is devoid of electronic components. The chamber/space S1 may have a plate for separating the speaker and the battery 11. The chamber/space S1 may have conductive wires therein. The chamber/space S1 may have solely conductive wires therein. The chamber/space S1 may have no active components. The chamber/space S1 may have no passive components. A space between the surface 11b of the battery 11 and the housing 14 is devoid of any electronic component.

The semiconductor device package 12 is disposed between the housing 14 and the surface 11c of the battery 11. The semiconductor device package 12 is disposed between the housing 14 and the surface 11b of the battery 11. The speaker 10 has a surface 10a facing the surface 11a of the battery 11. The semiconductor device package 12 is disposed between the housing 14, the surface 11c of the battery 11 and the surface 10a of the speaker 10. The semiconductor device package 12 is disposed between the housing 14, the surface 11b of the battery 11 and the surface 10a of the speaker 10. The semiconductor device package 12 is surrounded by the housing 14, the surface 11c of the battery 11 and the surface 10a of the speaker 10. The semiconductor device package 12 is surrounded by the housing 14, the surface 11b of the battery 11 and the surface 10a of the speaker 10. The semiconductor device package 12 is disposed in a chamber/space defined by the housing 14, the surface 11c of the battery 11 and the speaker 10. The semiconductor device package 12 is disposed in a chamber/space defined by the housing 14, the surface 11b of the battery 11 and the speaker 10. The housing 14 encloses the speaker 10, the battery 11 and the semiconductor device package 12. The housing 14 has an end 14a and an end 14b opposite the end 14a. An opening (not shown in FIG. 1B) may be disposed on the end 14a. Antenna patterns 16 are formed on the housing 14. A feeding point (not denoted in FIG. 1B) of the semiconductor device package 12 is in contact with the antenna patterns 16.

Referring again to FIG. 1B, assuming the speaker 10 can have a width or diameter of approximately 6 mm, a maximum distance Z1 between the end 14a (which can be fitted or plugged into an ear) and the end 14b along the z axis can be equal to or less than 23 mm. For example, assuming the speaker 10 can have a width or diameter of approximately 6 mm, a distance Z1 between the end 14a (which can be fitted or plugged into an ear) and the end 14b along the z axis can be equal to or less than 20 mm. Accordingly, the semiconductor device package 12 can facilitate miniaturization of the acoustic device 1. Arrangement of the semiconductor device package 12 can facilitate miniaturization of the acoustic device 1.

For example, assuming the speaker 10 can have a width or diameter of approximately 10 mm, a distance Z1 between the end 14a (which can be fitted or plugged into an ear) and the end 14b along the z axis can be equal to approximately 23 mm.

Figure 1C:
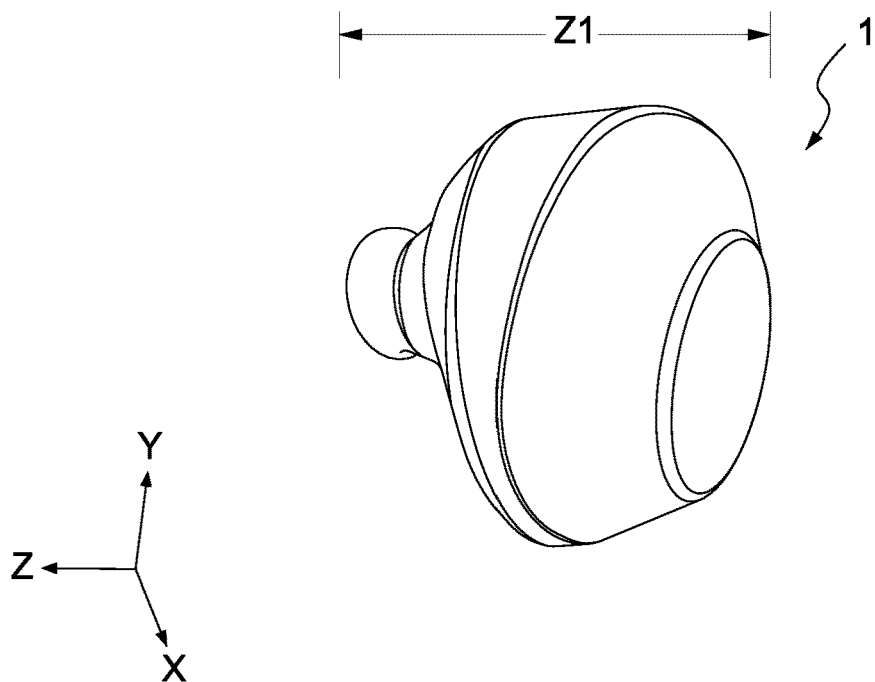
FIG. 1C illustrates a side view of the assembly of the acoustic device shown in FIG. 1B.

Referring to FIG. 1C, assuming the speaker 10 can have a width or diameter of approximately 6 mm, a maximum distance of the acoustic device 1 along the x axis can be equal to or less than 17 mm. Additionally, assuming the speaker 10 can have a width or diameter of approximately 6 mm, a maximum distance of the acoustic device 1 along the y axis can be equal to or less than 20 mm.

Figure 2A:
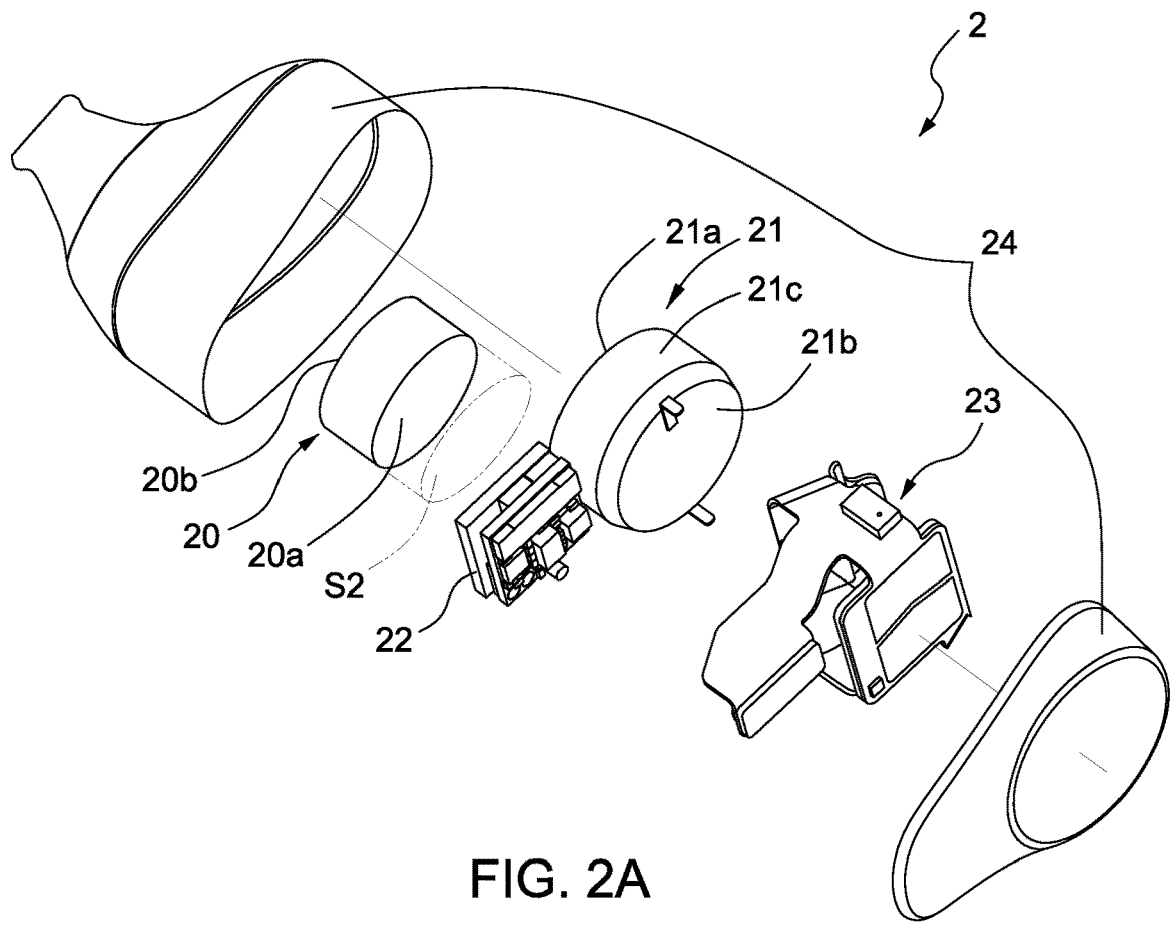
FIG. 2A illustrates an exploded view of an acoustic device in accordance with some embodiments of the present disclosure.

FIG. 2A illustrates an exploded view of an acoustic device 2 in accordance with some embodiments of the present disclosure. The acoustic device 2 includes a speaker 20, a battery 21, a semiconductor device package 22, an interconnect structure 23 and a housing 24. The speaker has a surface 20a and a surface 20b opposite to the surface 20a. The battery 21 has a surface 21a, a surface 21b opposite the surface 21a, and a surface 21c extended between the surface 21a and the surface 21b. The battery 21 is disconnected from any protecting circuits. The battery 21 includes a coin-like package. The battery 21 includes no aluminum cover. Because the battery 11 includes special structures (e.g. fuses) and special recipes of electrolytes, the battery 11 does not inflate or explode after use for a while.

The speaker 20 is disposed adjacent to the surface 21a of the battery 21. The surface 20a of the speaker 20 faces with the surface 21a of the battery 21. The surface 21a of the battery 21 may be a cathode of the battery 21. The structure of the semiconductor device package 22 may be illustrated in the cross-sectional view of the semiconductor device package 5 in FIG. 5. The speaker 20 is separated from the battery 21 by a chamber/space S2. The housing 24 encloses the speaker 20, the battery 21, the semiconductor device package 22, and the interconnect structure 23. The interconnect structure 23 connects the battery 21 and the semiconductor device package 22. The interconnect structure 23 includes flexible print circuit (FPCs) or other interconnect structures.

FIG. 2B illustrates a perspective view of an assembly of the acoustic device 2 as shown in FIG. 2A. The semiconductor device package 22 is disposed adjacent to the surface 21c of the battery 21. The semiconductor device package 22 is disposed adjacent to the surface 21b of the battery 21. The semiconductor device package 22 is electrically connected to the surface 21c of the battery 21 by the interconnect structure 23. The speaker 20 is separated from the surface 21a of the battery 21 by the chamber/space S2. The chamber/space S2 is devoid of electronic components. The chamber/space S2 may include a plate for separating the speaker and the battery 11. The chamber/space S2 may include conductive wires therein. The chamber/space S2 may include solely conductive wires therein. The chamber/space S2 may include no active components. The chamber/space S2 may include no passive components. A space (not denoted in FIG. 2B) between the surface 21b of the battery 21 and the housing 24 is devoid of any electronic component.

The semiconductor device package 22 is disposed between the housing 24 and the surface 21c of the battery 21. The semiconductor device package 22 is disposed between the housing 24 and the surface 21b of the battery 21. The speaker 20 has a surface 20a facing the surface 21a of the battery 21. The semiconductor device package 22 is disposed between the housing 24, the surface 21c of the battery 21 and the surface 20a of the speaker 20. The semiconductor device package 22 is disposed between the housing 24, the surface 21b of the battery 21 and the surface 20a of the speaker 20. The semiconductor device package 22 is surrounded by the housing 24, the surface 21c of the battery 21 and the surface 20a of the speaker 20. The semiconductor device package 22 is surrounded by the housing 24, the surface 21b of the battery 21 and the surface 20a of the speaker 20. The semiconductor device package 22 is disposed in a chamber/space defined by the housing 24, the surface 21c of the battery 21 and the speaker 20. The semiconductor device package 22 is disposed in a chamber/space defined by the housing 24, the surface 21b of the battery 21 and the speaker 20. The housing 24 encloses the speaker 20, the battery 21 and the semiconductor device package 22. The housing 24 has an end 24a and an end 24b opposite the end 24a. Antenna patterns 26 are formed on the housing 24. A feeding point (not denoted in FIG. 2B) of the semiconductor device package 22 is in contact with the antenna patterns 26.

Referring again to FIG. 2B, assuming the speaker 10 can have a width or diameter of approximately 10 mm, a maximum distance Z2 between the end 24a (which can be fitted or plugged into an ear) and the end 24b along the z axis can be equal to or less than 23 mm. Because the semiconductor device package 22 is used, a larger speaker can be accommodated and used in the acoustic device 2, which can improve the acoustic performance of the acoustic device 2. Accordingly, the semiconductor device package 22 can facilitate acoustic performance of the acoustic device 2. Arrangement of the semiconductor device package 22 can facilitate acoustic performance of the acoustic device 2.

The connector 23 may include a sensor (not denoted in FIG. 2B) disposed on the connector 23 and located between the housing 24 and the surface 21c of the battery 21. The sensor may be a proximity sensor. The proximity sensor determines a working mode (after being worn) or a standby mode. There may be an opening (not denoted in FIG. 2B) on the housing 24 corresponding to a sensing surface (not denoted in FIG. 2B) of the proximity sensor.

The connector 23 may include another sensor 25 disposed on the connector 23 and located between the housing 24 and the surface 21a of the battery 21. The sensor 25 may be a heart rate sensor. The heart rate sensor may sense the heart rate of a person wearing the acoustic device 2. There may be an opening (not denoted in FIG. 2B) on the housing 24 corresponding to a sensing surface (not denoted in FIG. 2B) of the sensor 25.

Referring to FIG. 2C, assuming the acoustic device 2 includes the speaker having a width or diameter of approximately 10 mm, a maximum distance Y1 of the acoustic device 2 along the y axis can be equal to or less than 24 mm.

Referring to FIG. 2D, assuming the acoustic device 2 includes the speaker having a width or diameter of approximately 10 mm, a maximum distance X1 of the acoustic device 2 along the x axis can be equal to or less than 18 mm.

Figure 3A:
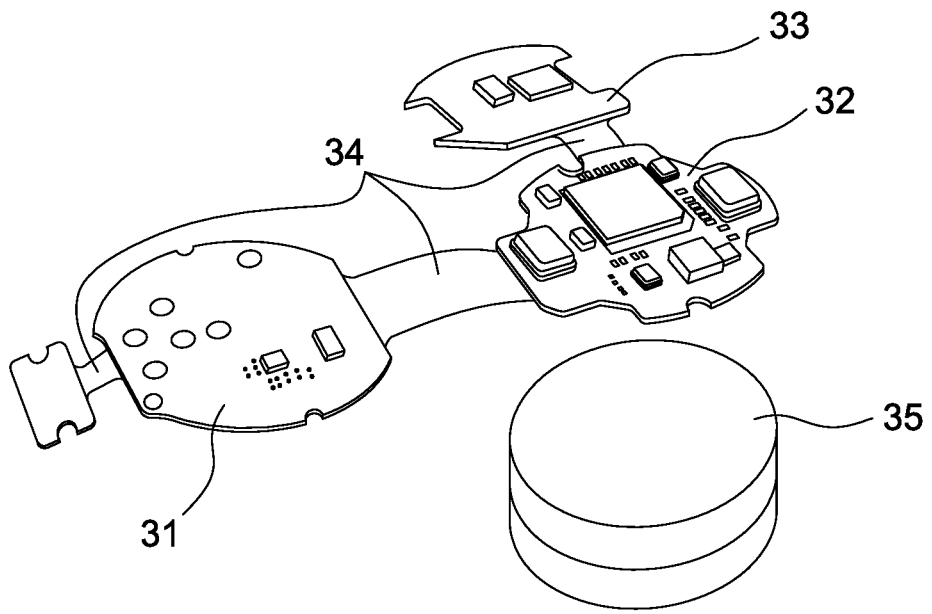
FIG. 3A illustrates an exploded view of electronic components of an acoustic device in accordance with some embodiments of the present disclosure.

FIG. 3A illustrates an exploded view of electronic components of an acoustic device. Circuit boards 31, 32 and 33 of an acoustic device are connected by an interconnect structure 34. Electronic components are formed on the circuit boards 31, 32 and 33. The interconnect structure 34 may include FPCs or other interconnect structures. A battery 35 can be provided in the acoustic device.

Figure 3B:
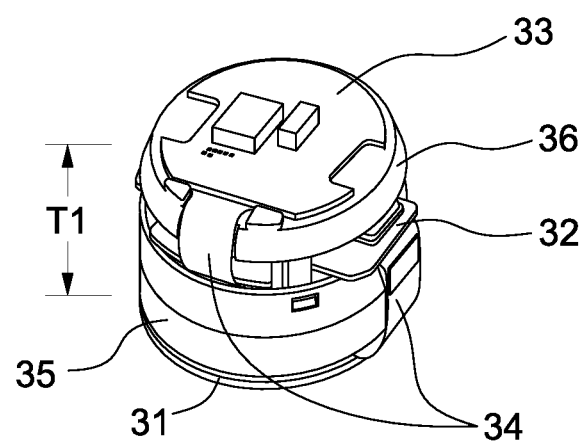
FIG. 3B illustrates an assembly of the electronic components of the acoustic device in accordance with some embodiments of the present disclosure.

FIG. 3B illustrates an assembly of the electronic components of the acoustic device in accordance with some embodiments of the present disclosure. The circuit boards 31, 32 and 33 are stacked. The thickness of the stack is T1. The circuit boards 31 and 32 and the interconnect structure 34 surround a battery 35. The circuit boards 32 and 33 and the interconnect structure 34 surround a mechanical component 36.

Figure 3C:
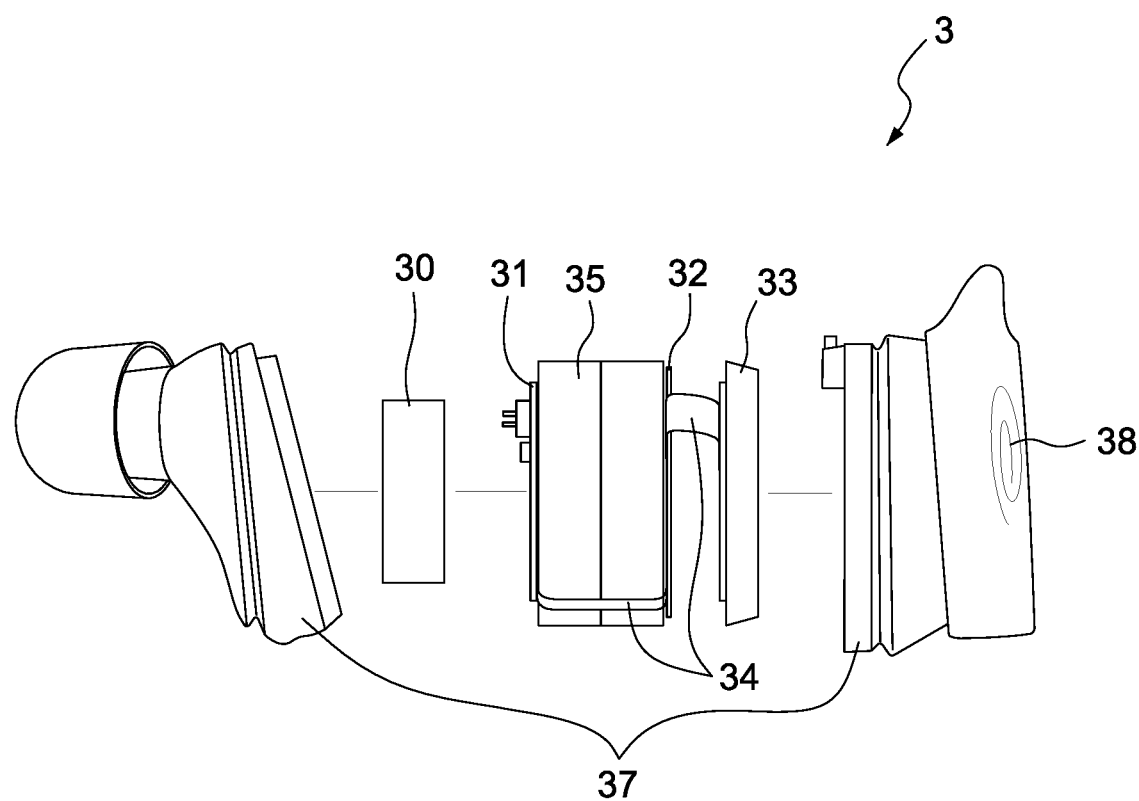
FIG. 3C illustrates an exploded view of an acoustic device in accordance with some embodiments of the present disclosure.

FIG. 3C illustrates an exploded view of an acoustic device 3. The acoustic device 3 may include a speaker 30, circuit boards 31, 32 and 33, the interconnect structure 34, a battery 35 and a housing 37. The circuit board 33 is disposed between the speaker 30 and the battery 35, which causes electromagnetic interference to the speaker 30 and thus degrades the acoustic performance of the acoustic device 3. The housing 37 encloses the speaker 30, the circuit boards 31, 32 and 33, the interconnect structures 34, and the battery 35. Antenna patterns 38 are formed on the housing 37. A feeding point (not denoted in FIG. 3C) on the circuit board 33 is in contact with the antenna patterns 38.

Figure 3D:
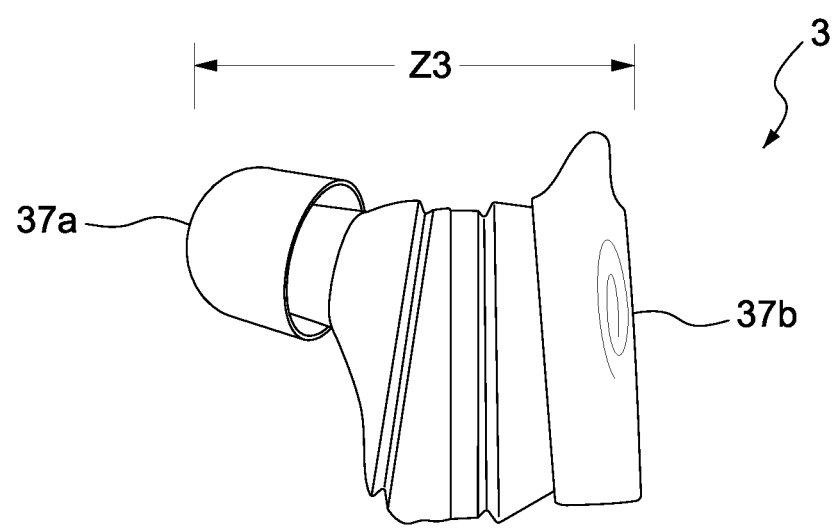
FIG. 3D illustrates a side view of an assembly of the acoustic device as shown in FIG. 3C.

FIG. 3D illustrates a side view of an assembly of the acoustic device 3 shown in FIG. 3C. In some embodiments, assuming the diameter of the speaker inside the acoustic device 3 is 6 mm, the maximum distance Z3 between an end 37a (which can be fitted or plugged into an ear) and an end 37b is equal to or larger than 23 mm. Because the thickness T1 shown in FIG. 3B is larger than the distance between an end 12a of the semiconductor device package 12 and the end 11a of the battery 11 along the z axis in FIG. 1B, the maximum distance Z3 of the acoustic device 3 is larger than the maximum distance Z1 of the acoustic device 1.

Figure 4A:
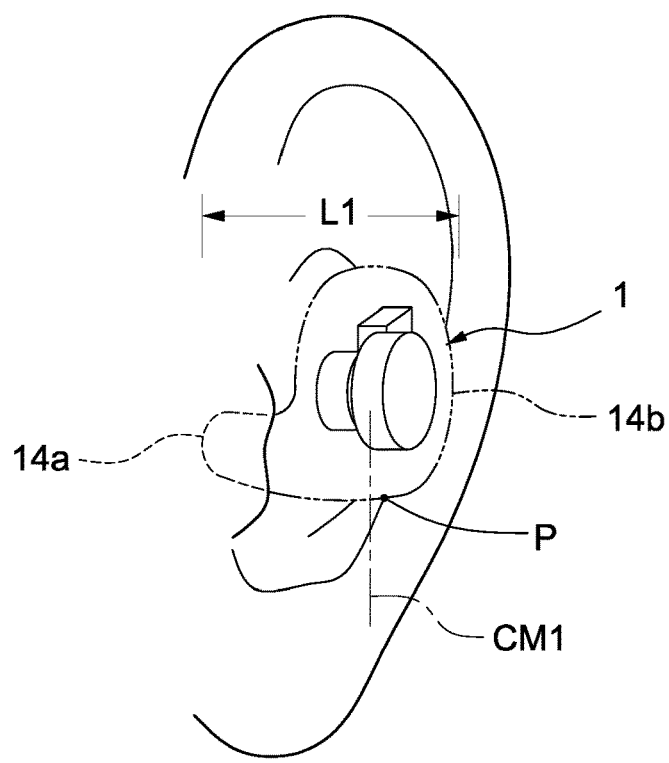
FIG. 4A illustrates an acoustic device in accordance with some embodiments of the present disclosure plugged in a human ear.

Referring to FIG. 4A, the acoustic device 1 shown in FIG. 1B is plugged into a human ear. The center of gravity CM1 may be adjacent or close to the end 14b. Due to the miniaturization of the acoustic device 1, when plugging the acoustic device 1 into the ear, the acoustic device 1 can be in contact with a point P of the ear. Accordingly, the acoustic device 1 can have a relatively good support of the ear. Accordingly, the acoustic device 1 would not easily fall out of the even when the person wearing the acoustic device 1 is moving or sweating.

Figure 4B:
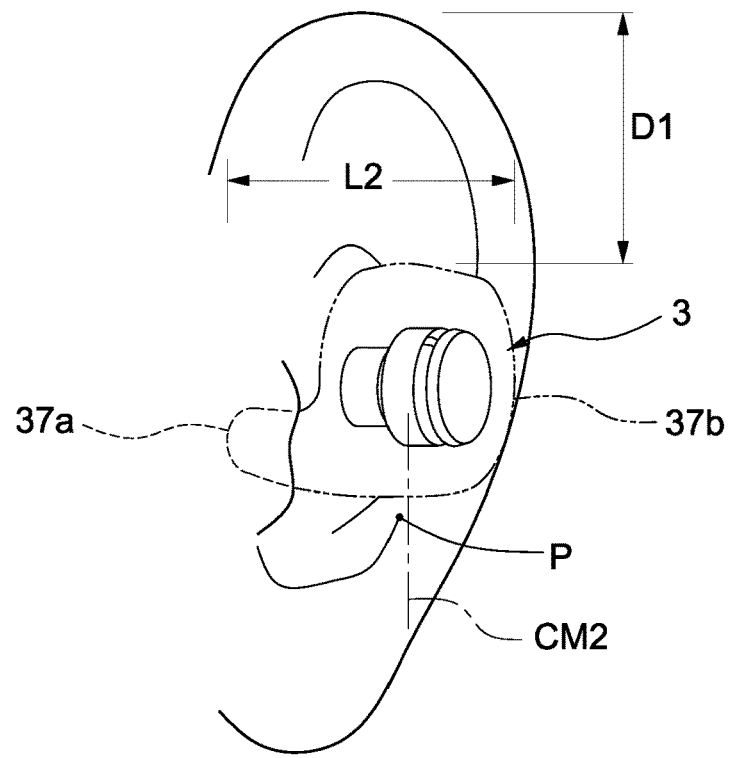
FIG. 4B illustrates an acoustic device in accordance with some other embodiments of the present disclosure plugged in a human ear.

Referring to FIG. 4B, the acoustic device 3 shown in FIG. 3D is plugged into a human ear. The center of gravity CM2 may be adjacent or close to the end 37b.

The acoustic device 3, which may have a relatively great size, may have a major portion (except the plug) that is floating. The acoustic device 3 may be spaced from the point P of the human ear. A distance D1 is between the top surface of the acoustic device 3 and the human ear.

Figure 4C:
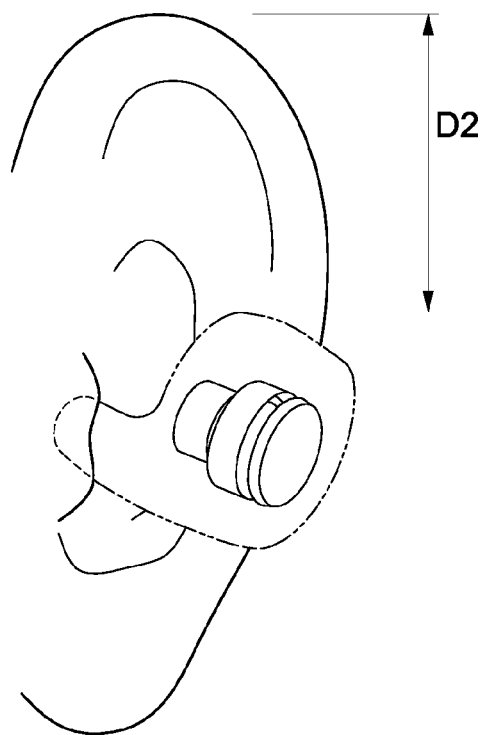
FIG. 4C illustrates the acoustic device shown in FIG. 4B falls out of the human ear.

FIG. 4C illustrates that the acoustic device 3 starts falling off the ear when the person wearing the acoustic device 3 swears, moves or change positions. The falling of the acoustic device 3 may be resulted from an unstable state as shown in FIG. 4B, in which the center of gravity CM2 may cause the acoustic device 3, which lacks support of the ear, relatively easy to fall out of the ear.

It is contemplated that a distance D2 from the top surface of the acoustic device 3 and the human ear is increasing due to the falling of the acoustic device 3. The distance D2 is larger than the distance D1.

Figure 5:
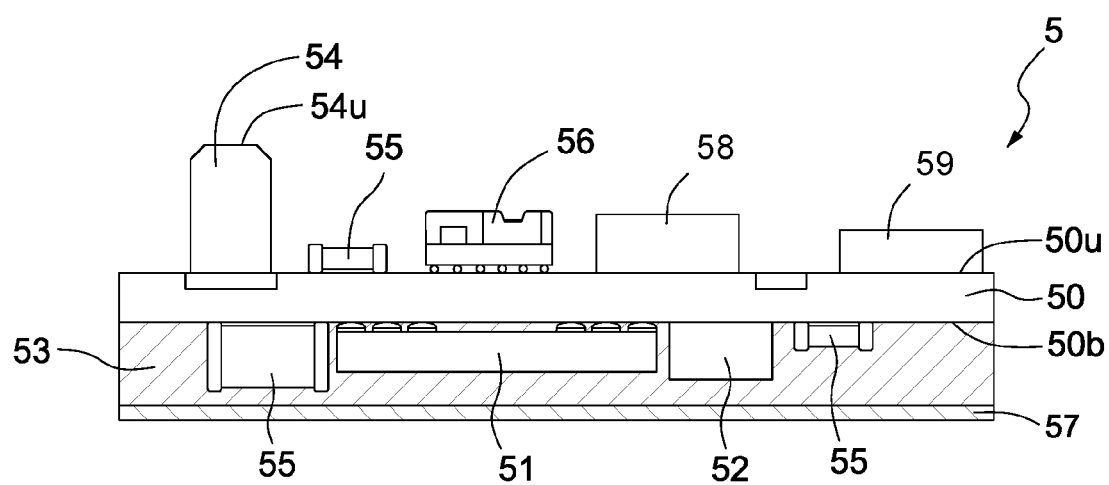
FIG. 5 illustrates a cross-sectional view of a semiconductor device package of the acoustic device as shown in FIGS. 1A and 2A.

FIG. 5 illustrates a cross-sectional view of the semiconductor device package 12 of the acoustic device 1 as shown in FIG. 1A. A semiconductor device package 5 can include a substrate 50, electronic components 51, 52, 55, an encapsulant 53, a feeding structure 54, a microphone 56, a shielding layer 57, a sensor 58, and a connector 59.

The substrate 50 has a surface 50b and a surface 50u opposite the surface 50b.

The semiconductor device 51 can be disposed on the surface 50b of the substrate 50. The electronic component 52 can be disposed on the surface 50b of the substrate 50. The encapsulant 53 can encapsulate the electronic component 51 on the surface 50b of the substrate 50. The encapsulant 53 can encapsulate the electronic component 52 on the surface 50b of the substrate 50. The shielding layer 57 is disposed on the encapsulant 53 to separate the semiconductor device package 5 from the battery 11 or 21 as shown in FIGS. 1A and 2A.

The feeding structure 54 can be disposed on the surface 50u of the substrate 50 and is devoid of encapsulant or molding material. The feeding structure 54 is exposed on the surface 50u of the substrate 50. The surface 50u of the substrate 50 is devoid of encapsulant or molding material. Electronic components 55 are disposed on both surfaces 50b and 50u of the substrate 50. The microphone 56 is disposed on the surface 50u. The microphone 56 may include a semiconductor device package. The microphone 56 may include a microelectromechanical systems (MEMS) device. The microphone 56 may include a microelectromechanical systems (MEMS) device package. The microphone 56 is exposed. The sensor 58 is disposed on the surface 50u of the substrate 50. The connector 59 is disposed on the surface 50u of the substrate 50. The surface 50b includes conductive pads for battery connection. The surface 50b includes conductive pads for speaker driver connection. The feeding structure 54 has a surface 54u higher than the microphone 56. The surface 54u is higher than the sensor 58. The surface 54u is higher than the connector 59. The feeding structure 54 is the highest among elements disposed on the surface 50u of the substrate 50.

The electronic components 51 and 52 may include one or more of application processors, memories, digital signal processors, coders/decoders, power management integrated circuits, DC converters, low dropout outputs or filters. The encapsulant 53 may include different kinds of molding materials. The feeding structure 54 includes a spring or a conductive pin. The feeding structure 54 includes a POGO pin. The feeding structure 54 also includes an antioxidation layer. The feeding structure 54 is configured to and can be used to feed a radio frequency (RF) signal to an antenna. The electronic components 55 may include one or more of resistors, inductors or capacitors. The sensor 58 may include a G-sensor or other sensors. The connector 59 includes a zero insertion force connector or a board-to-board connector for peripheral function flexible printed circuit (FPC) connection.

Figure 6A:
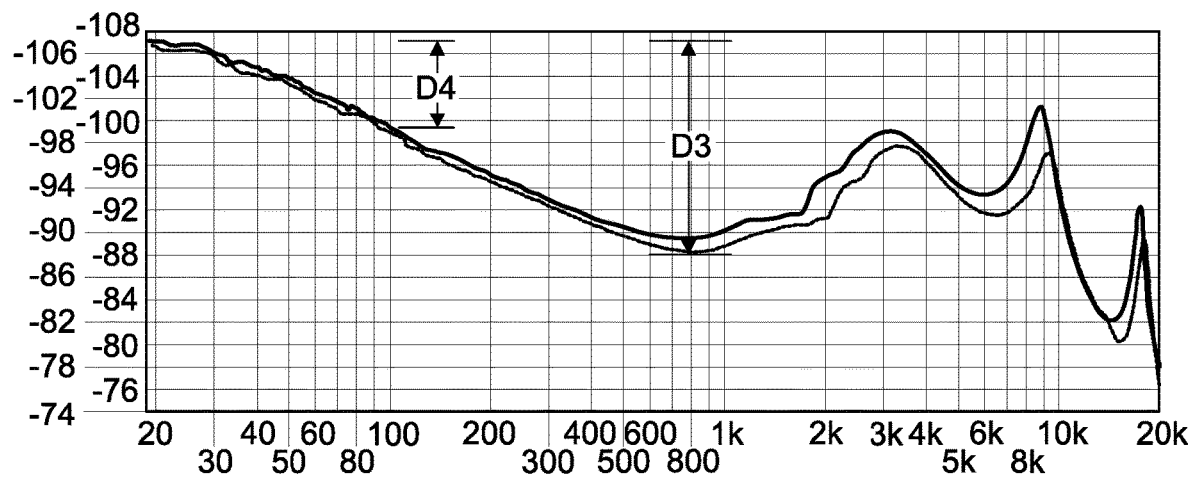
FIG. 6A illustrates frequency response of an earphone pair in accordance with an embodiment of the present disclosure.

FIG. 6A illustrates the frequency response curve of the assembly of a set of acoustic devices as shown in FIG. 3C. The distance Z3 of the acoustic device 3 as shown in FIG. 3D can be equal to or less than 23 mm. The earphone includes a speaker having a width or diameter of 6 mm. The unit of the horizontal axis is frequencies (represented with Hz). The unit of the horizontal axis is amplitudes (represented with dB) of an acoustic device. The two curves of FIG. 6A represents frequency response curves of the left earphone and the right earphone, respectively. As shown in FIG. 6A, the performance of the two earphones are similar. Additionally, the difference D3 between the amplitude at relatively low frequencies (about 20 Hz to 100 Hz) and the amplitude at middle frequencies (about 100 Hz to 1 KHz) is equal to or larger than about 19 db. The difference D4 between the amplitude at low frequencies (about 20 Hz to 100 Hz) is equal to or larger than about 8 db. The smaller the difference D3 is, the better the acoustic performance of the acoustic device 3 is. The smaller the difference D4 is, the better the acoustic performance of the acoustic device 3 is.

Figure 6B:
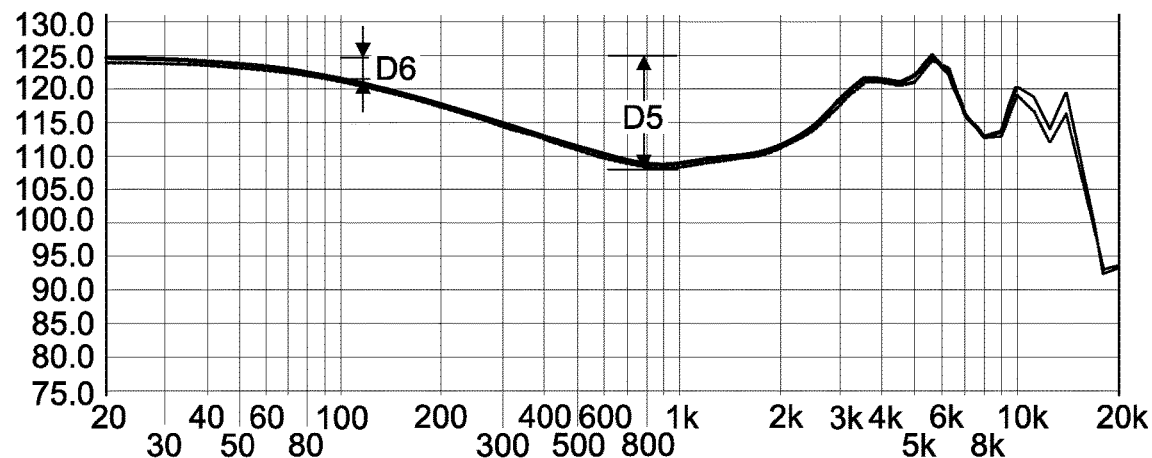
FIG. 6B illustrates frequency response of another earphone pair in accordance with an embodiment of the present disclosure.

FIG. 6B illustrates the frequency response curve of the assembly of a set of acoustic devices as shown in FIG. 2B. The distance Z2 of the acoustic device 2 as shown in FIG. 2B can be equal to or less than 23 mm. The earphone includes a speaker having a width or diameter of 10 mm. The maximum distance Z2 as shown in FIG. 2B is equal to or similar to the maximum distance Z3 as shown in FIG. 3D. The unit of the horizontal axis is frequencies (represented with Hz). The unit of the horizontal axis is amplitudes (represented with dB) of an acoustic device. The two curves of FIG. 6B represents frequency response curves of the left earphone and the right earphone, respectively. As shown in FIG. 6B, the performance of the two earphones are similar. Additionally, the difference D5 between the amplitude at relatively low frequencies (about 20 Hz to 100 Hz) and the amplitude at middle frequencies (about 100 Hz to 1 KHz) is equal to or less than about 14 db. The difference D6 between the amplitude at low frequencies (about 20 Hz to 100 Hz) is equal to or less than about 3 db. The smaller the difference D5 is, the better the acoustic performance of the acoustic device 2 is. The smaller the difference D6 is, the better the acoustic performance of the acoustic device 2 is.

Figure 7:
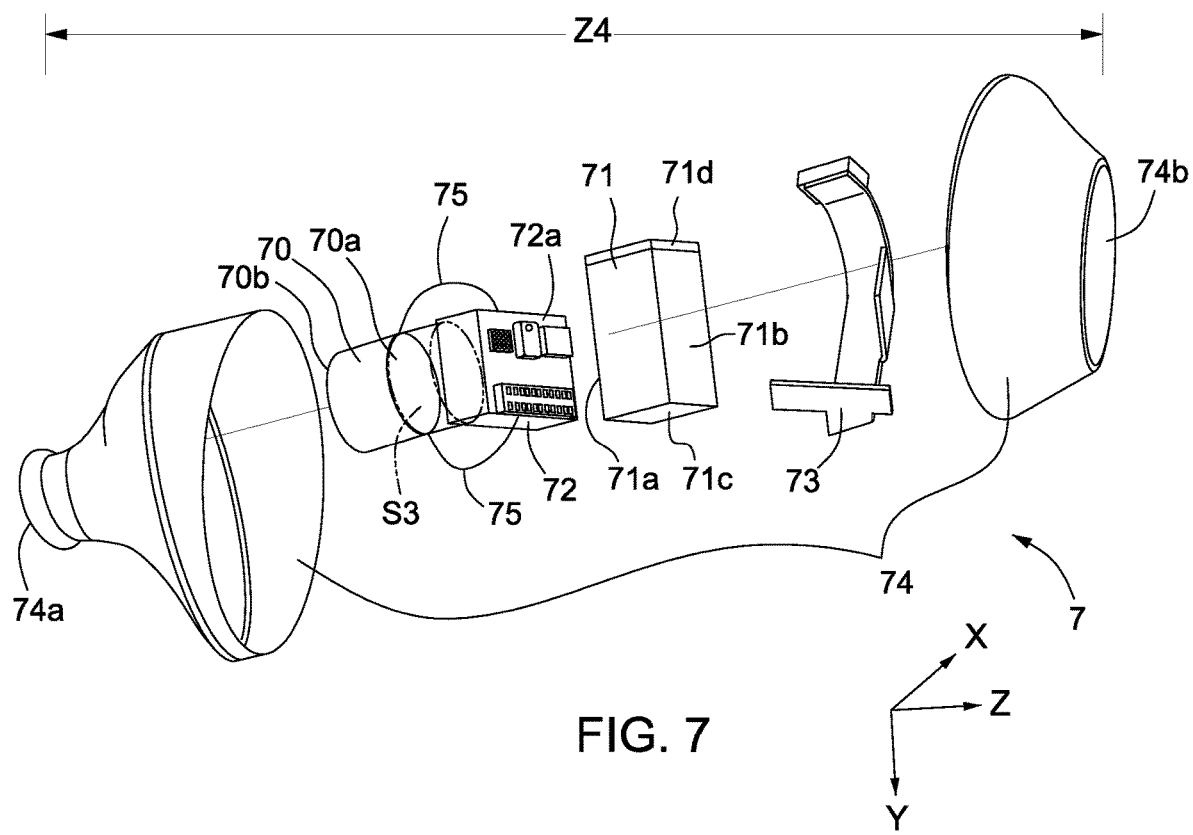
FIG. 7 illustrates an exploded view of an acoustic device in accordance with some embodiments of the present disclosure.

FIG. 7 illustrates an exploded view of an acoustic device 7 in accordance with some embodiments of the present disclosure. The acoustic device 7 includes a speaker 70, a battery 71, a semiconductor device package 72, an interconnect structure 73 and a housing 74. The speaker has a surface 70a and a surface 70b opposite to the surface 70a. The battery 71 has a surface 71a, a surface 71b opposite the surface 71a, and a surface 71c extended between the surface 71a and the surface 71b. The battery 71 has a package different from the battery 11 as shown in FIGS. 1A and 2A. The battery 71 is connected to a protecting circuit 71d. The battery 71 includes a lithium rechargeable battery. The battery 71 includes an aluminum cover. The protecting circuit 71d can control the voltages and currents flowed into the battery 71. The protecting circuit 71d can control the voltages and currents flowed out of the battery 71. The protecting circuit 71d can protect the battery 71 from being inflated or even exploded after working for a while.

The speaker 70 is disposed adjacent to the semiconductor device package 72. The battery 71 faces with a surface 72a of the semiconductor device package 72. The speaker 70 is connected to the semiconductor device package 72 by wires 75. The speaker 70 is separated from the semiconductor device package 72 by a chamber/space S3. The housing 74 encloses the speaker 70, the battery 71, the semiconductor device package 72, and the interconnect structure 73. The interconnect structure 73 connects the battery 71 and the semiconductor device package 72. The interconnect structure 73 includes flexible print circuit (FPCs) or other interconnect structures.

A maximum distance of the acoustic device 7 along the x axis can be equal to or larger than 20 mm. A maximum distance of the acoustic device 7 along the y axis can be equal to or larger than 28 mm. A maximum distance Z4 between an end 74a (which can be fitted or plugged into an ear) and an end 74b along the z axis can be equal to or larger than 24 mm.

The size of the battery 71 is dependent on temperature. As the battery 71 has been working for a while, the temperature of the battery 71 will increase, which causes the size of the battery 71 to increase. Therefore, a relatively great space (not denoted in FIG. 7) for accommodating the battery 71 is included because the battery 71 will inflate after use. Accordingly, the distance between the battery 71 and the semiconductor device package 72 will increase. The distance between the battery 71 and the semiconductor device package 72 will increase.

Assuming a lithium rechargeable battery with aluminum cover is used as the battery 71, the capacity of the battery 71 may be less than 50 mAh. For example, the battery 71 may include capacity of approximately 45 mAh.

Furthermore, a relatively great space (not denoted in FIG. 7) for accommodating the battery 71 is included because the battery 71 will inflate after use. Assuming the battery 11 includes a capacity similar to that of the battery 71, the size of the acoustic device 7 including the battery 71 may be larger than that of the acoustic device 1 including the battery 11.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A wireless earphone, comprising:
a semiconductor device package;

a battery, wherein the semiconductor device package and the battery are arranged along a first axis of the wireless earphone;

a speaker, wherein the battery and the speaker are arranged along a second axis of the wireless earphone substantially perpendicular to the first axis; and a housing encapsulating the semiconductor device package, the battery, and the speaker;

wherein the battery has a planar surface and a curved surface, wherein the planar surface faces the speaker;

wherein the semiconductor device package is disposed over the curved surface of the battery and the speaker is disposed over the planar surface of the battery;

wherein the housing has a first surface extending upwardly from an end of the wireless earphone configured to be plugged into an ear canal to a top end of the housing and a second surface extending downwardly from the end of the wireless earphone to a bottom end of the housing;

wherein a first slope of the first surface of the housing is higher than a second slope of the second surface of the housing;

wherein a first curvature of the first surface of the housing is different from a second curvature of the second surface of the housing;

wherein the semiconductor device package is disposed in a first space of the housing, wherein the speaker and the battery are disposed in a second space of the housing different from the first space, and wherein the first surface of the housing overlaps the first space and the second space in a direction along the second axis; and wherein the second surface of the housing overlaps the second space but does not overlap the first space in the direction along the second axis.

2. The wireless earphone of claim 1, wherein the speaker is disposed between the planar surface of the battery and the end of the wireless earphone configured to be plugged into the ear canal.

3. The wireless earphone of claim 2, wherein a projection of the speaker on the battery along the second axis is entirely within the planar surface of the battery.

4. The wireless earphone of claim 3, wherein the semiconductor device package and the planar surface of the battery are not overlapped along the first axis and the second axis.

5. The wireless earphone of claim 1, wherein when the end of the wireless earphone is plugged into the ear canal, the semiconductor device package is higher than the end of the wireless earphone.

6. The wireless earphone of claim 5, wherein when the end of the wireless earphone is plugged into the ear canal, the semiconductor device package is higher than the ear canal.

7. The wireless earphone of claim 6, wherein when the end of the wireless earphone is plugged into the ear canal, the semiconductor device package is disposed around a location between the ear canal and an ear helix.

8. The wireless earphone of claim 1, wherein when the wireless earphone is worn on an ear, a projection of the semiconductor device package on the ear and a projection of the battery on the ear are not overlapped.

9. The wireless earphone of claim 1,
wherein the semiconductor device package is entirely in the first space of the housing;
wherein the speaker and the battery are entirely in the second space of the housing; and
wherein the end of the wireless earphone configured to be plugged into the ear canal is in the second space of the housing.

* * * * *